(12) United States Patent
Hopper et al.

(10) Patent No.: US 8,466,535 B2
(45) Date of Patent: Jun. 18, 2013

(54) GALVANIC ISOLATION FUSE AND METHOD OF FORMING THE FUSE

(75) Inventors: Peter J. Hopper, San Jose, CA (US);
William French, San Jose, CA (US);
Ann Gabrys, Santa Clara, CA (US);
Martin Fallon, Glasgow (GB)

(73) Assignee: National Semiconductor Corporation, Santa Clara, CA (US)

( * ) Notice: Subject to any disclaimer, the term of this patent is extended or adjusted under 35 U.S.C. 154(b) by 14 days.

(21) Appl. No.: 13/208,890

(22) Filed: Aug. 12, 2011

(65) Prior Publication Data

US 2013/0037908 A1    Feb. 14, 2013

(51) Int. Cl.
*H01L 27/06* (2006.01)
(52) U.S. Cl.
USPC ........... 257/529; 257/503; 257/539; 257/762; 257/E21.002; 257/E27.014

(58) Field of Classification Search
None
See application file for complete search history.

(56) References Cited

U.S. PATENT DOCUMENTS

| | | | |
|---|---|---|---|
| 2003/0173611 A1* | 9/2003 | Bertz et al. | 257/302 |
| 2010/0144116 A1* | 6/2010 | Hopper et al. | 438/427 |
| 2011/0174999 A1* | 7/2011 | French et al. | 250/551 |

OTHER PUBLICATIONS

U.S. Appl. No. 12/827,316, filed Jun. 30, 2010 to William French et al.

* cited by examiner

*Primary Examiner* — Minh-Loan T Tran
*Assistant Examiner* — Fazli Erdem
(74) *Attorney, Agent, or Firm* — Eugene C. Conser; Wade J. Brady, III; Frederick J. Telecky, Jr.

(57) ABSTRACT

The spikes in current and voltage that result from the failure of a galvanic dielectric layer are safely contained by a galvanic isolation fuse that pops and forms and open circuit between a high-voltage die and a low-voltage die in response to the failure of the galvanic dielectric layer.

8 Claims, 12 Drawing Sheets

GALVANIC ISOLATION FUSE AND METHOD OF FORMING THE FUSE

BACKGROUND OF THE INVENTION

1. Field of the Invention

The present invention relates to galvanic isolation and, more particularly, to a galvanic isolation fuse and a method of forming the fuse.

2. Description of the Related Art

Galvanic isolation refers to an isolation that prevents a first system from communicating with a second system by way of a flow of electrons from one system to the other system, but which allows the two systems to communicate in other ways. For example, the first system can transmit a signal to the second system using changes in inductance or capacitance, or by using optical or other means.

Galvanic isolation is typically implemented with a dielectric layer that lies between and electrically isolates a first conductor, such as the first coil of a transformer or the first plate of a capacitor, and a second conductor, such as the second coil of the transformer or the second plate of the capacitor. Galvanic isolation is commonly used in multi-die chips that operate with different ground potentials and require a large isolation voltage, such as $5000V_{RMS}$.

Figure 1:
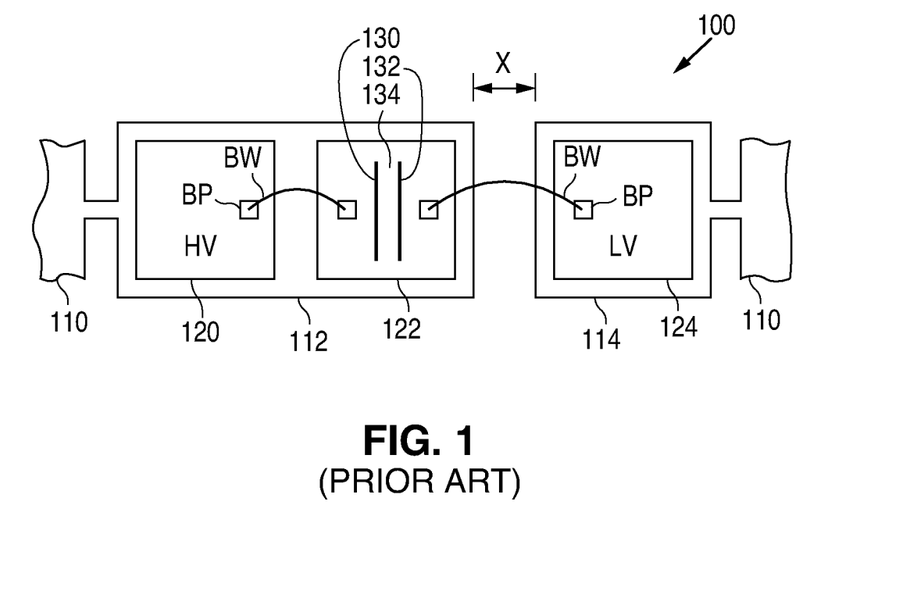
FIG. 1 is a plan view illustrating an example of a prior-art, galvanically-isolated, multi-die chip 100.

FIG. 1 shows a plan view that illustrates an example of a prior-art, galvanically-isolated, multi-die chip 100. As shown in FIG. 1, chip 100 includes a lead frame 110 that has a high-voltage die attach pad or paddle (DAP) 112, and a low-voltage DAP 114 that is electrically isolated from high-voltage DAP 112. Two-DAP lead frames commonly have a DAP-to-DAP spacing X of 0.5 mm.

As further shown in FIG. 1, multi-die chip 100 also includes a high-voltage die 120 that has high-voltage circuitry and signals, a galvanic isolation die 122, and a low-voltage die 124 that has low-voltage circuitry and signals. High-voltage die 120 and galvanic isolation die 122 are both physically attached to DAP 112 of lead frame 110, while low-voltage die 124 is physically attached to DAP 114 of lead frame 110.

In the present example, galvanic isolation die 122 utilizes changes in capacitance to transmit signals and, as a result, includes a capacitor for each signal to be transmitted. (Only one signal path or channel and one capacitor are shown for clarity.) Each capacitor, in turn, includes a high-voltage plate 130 that is electrically connected to a corresponding bond pad BP on high-voltage die 120 by way of a bonding wire BW, a low-voltage plate 132 that is electrically connected to a corresponding bond pad BP on low-voltage die 124 by way of a bonding wire BW, and a dielectric layer 134 that lies between and touches high-voltage plate 130 and low-voltage plate 132. In the present example, dielectric layer 134 can withstand a plate 130-to-plate 132 voltage difference of $5000V_{RMS}$ without suffering dielectric breakdown.

In operation, high-voltage die 120 transmits data to low-voltage die 124 by encoding the data, and then placing encoded data signals in the form of pulses, RF waveforms, or glitches onto high-voltage plate 130. The signals are capacitively coupled to low-voltage plate 132, and are then detected and decoded by low-voltage die 124.

One of the drawbacks of using a dielectric layer to provide galvanic isolation is that over time the dielectric layer will eventually break down. For example, a common failure in MOS transistors is time dependent dielectric breakdown (TDDB), which is when the gate oxide breaks down as a result of the stress from an electric field over a long period of time.

However, unlike the failure of the gate oxide in a MOS transistor, which may lead to the loss of functionality of a circuit or system, the failure of a dielectric layer used to provide galvanic isolation, which effectively shorts the high-voltage circuitry of the high-voltage die to the low-voltage circuitry of the low-voltage die, leads to spikes in current and voltage and the catastrophic failure of the low-voltage circuitry.

The spikes in current and voltage, in turn, are potential safety issues. Thus, there is a need for an approach to ensuring that the spikes in current and voltage that result from the failure of a galvanic dielectric layer are safely contained.

BRIEF DESCRIPTION OF THE DRAWINGS

FIGS. 2A-2B are views illustrating an example of a galvanic isolation fuse 200 in accordance with the present invention. FIG. 2A is a plan view, while

FIGS. 3A-3B are views illustrating an example of a galvanic isolation fuse 300 in accordance with an alternate embodiment of the present invention. FIG. 3A is a plan view, while

DETAILED DESCRIPTION OF THE INVENTION

Figure 2A:
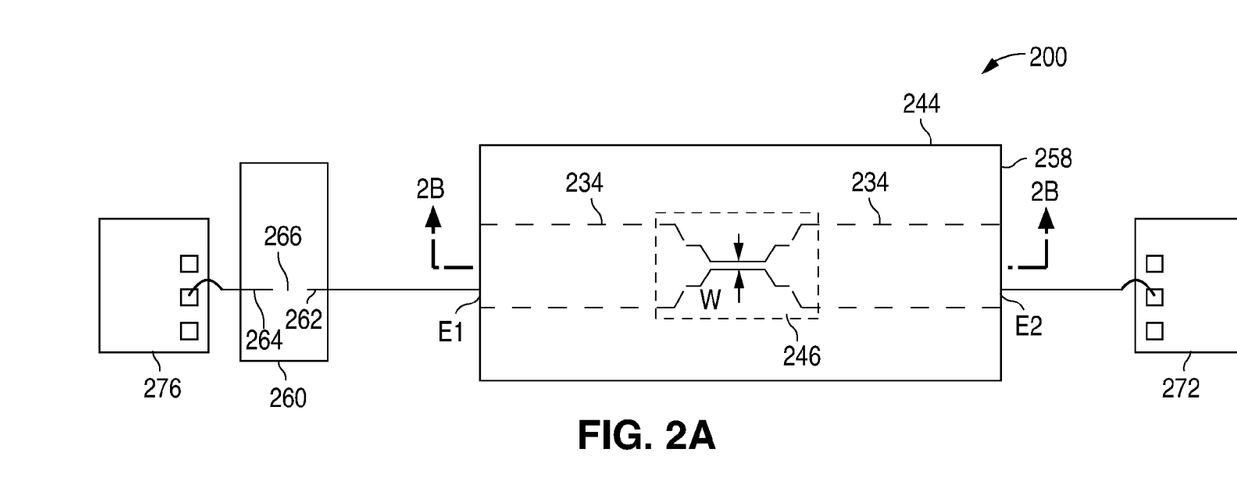
Figure 2B:
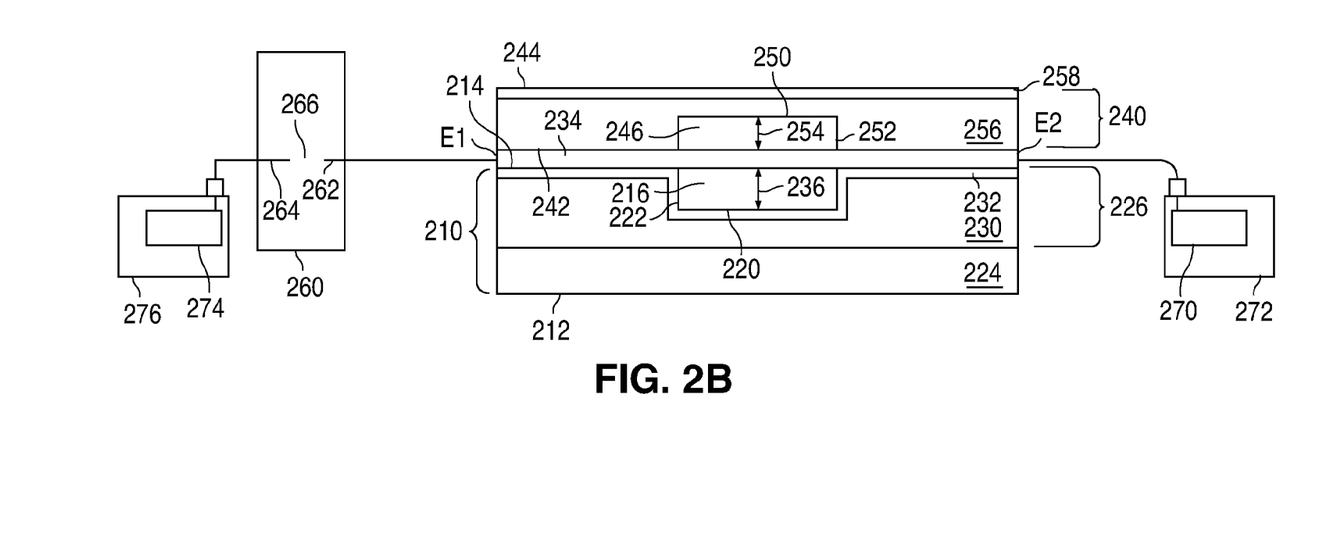
FIG. 2B is a cross-sectional view taken along lines 2B-2B of FIG. 2A.

FIGS. 2A-2B show views that illustrate an example of a galvanic isolation fuse 200 in accordance with the present invention. FIG. 2A shows a plan view, while FIG. 2B shows a cross-sectional view taken along lines 2B-2B of FIG. 2A. As described in greater detail below, the present invention utilizes a galvanic isolation fuse to safely contain the spikes in current and voltage that result from the failure of a galvanic dielectric layer.

As shown in FIGS. 2A-2B, galvanic isolation fuse 200 includes a substrate structure 210 that has a bottom surface 212, a top surface 214, and a cavity 216. The top surface 214 of substrate structure 210 is non-conductive. Cavity 216, in turn, has a bottom surface 220 and a side wall surface 222 that extends from the bottom surface 220 of cavity 216 to the top surface 214 of substrate structure 210. In the present example, cavity 216 exposes only non-conductive regions of substrate structure 210.

As illustrated, substrate structure 210 can be implemented with a silicon substrate 224 and a non-conductive layer 226 that touches the top surface of silicon substrate 224. Non-conductive layer 226, in turn, can be implemented with, for example, a silicon dioxide layer 230 that touches the top surface of silicon substrate 224, and a silicon nitride layer 232 that touches the top surface of oxide layer 230. Nitride layer 232 protects oxide layer 230 from moisture degradation.

As an alternative to a non-conductive layer that overlies a substrate material, other materials, such as glass (quartz, borosilicate glass (BSG), and diamond), can also be used to implement substrate structure 210. One advantage of silicon over glass is that a silicon substrate can be easily back ground to accommodate any package size limitations. In addition, using glass eliminates parasitic coupling and loses associated with a conductive substrate.

As further shown in FIGS. 2A-2B, galvanic isolation fuse 200 also includes a signal line 234 that touches the top surface 214 of substrate structure 210 and extends completely across cavity 216 so that a gap 236 lies between signal line 234 and the bottom surface 220 of cavity 216. In addition, signal line 234 has a number of widths, with a minimum width W of signal line 234 lying over cavity 216. Further, signal line 234 has opposite ends E1 and E2, and cavity 216 lies between and spaced apart from the ends E1 and E2.

As additionally shown in FIGS. 2A-2B, galvanic isolation fuse 200 includes a non-conductive structure 240 that has a bottom surface 242, a top surface 244, and a cavity 246. The bottom surface 242 of non-conductive structure 240 touches signal line 234 and the top surface 214 of substrate structure 210.

Further, cavity 246 has a top surface 250 and a side wall surface 252 that extends from the top surface 250 of cavity 246 down to the bottom surface 242 of non-conductive structure 240. Additionally, cavity 246 lies over cavity 216 and signal line 234 so that a gap 254 lies between signal line 234 and the top surface 250 of cavity 246.

As illustrated, non-conductive structure 240 can be implemented with, for example, a silicon dioxide layer 256 that touches the top surface of substrate structure 210 and signal line 234, and a silicon nitride layer 258 that touches the top surface of oxide layer 256. Nitride layer 258 protects oxide layer 256 from moisture degradation.

As shown schematically in FIGS. 2A-2B, galvanic isolation fuse 200 is electrically connected to a galvanically-isolated structure 260 that has a first conductive structure 262 that is electrically connected to end E1 of signal line 234, a second conductive structure 264, and a dielectric structure 266 that lies between and touches first conductive structure 262 and second conductive structure 264.

First conductive structure 262 can be, for example, the first coil of a transformer or the first plate of a capacitor, while second conductive structure 264 can be, for example, the second coil of the transformer or the second plate of the capacitor. Further, dielectric structure 266 provides a very large voltage isolation, such as $5000V_{RMS}$. In the present example, the first and second conductive structures 262 and 264 have resistances that are less than the resistance of signal line 234.

In addition, the end E2 of signal line 234 of galvanic isolation fuse 200 is also electrically connected to an electronic circuit 270, such as the electronic circuit in a die 272. Further, the second conductive structure 264 of galvanically-isolated structure 260 is electrically connected to an electronic circuit 274, such as the electronic circuit in a die 276.

In operation, the section of signal line 234 with the minimum width W functions as a fuse which can withstand a current level specified for normal operating conditions, but which pops and provides an open circuit in response to the increased heat when the current level spikes well above the specified current level as a result of the failure of the galvanic dielectric structure 266. Thus, one of the advantages of the present invention is that galvanic isolation fuse 200 safely contains the spikes in current and voltage that result from the failure of a galvanic dielectric layer.

Figure 3A:
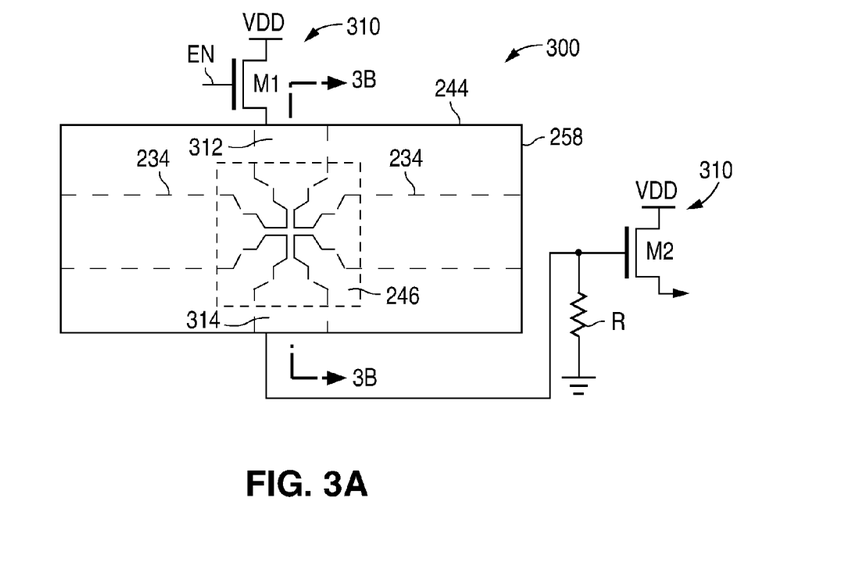
Figure 3B:
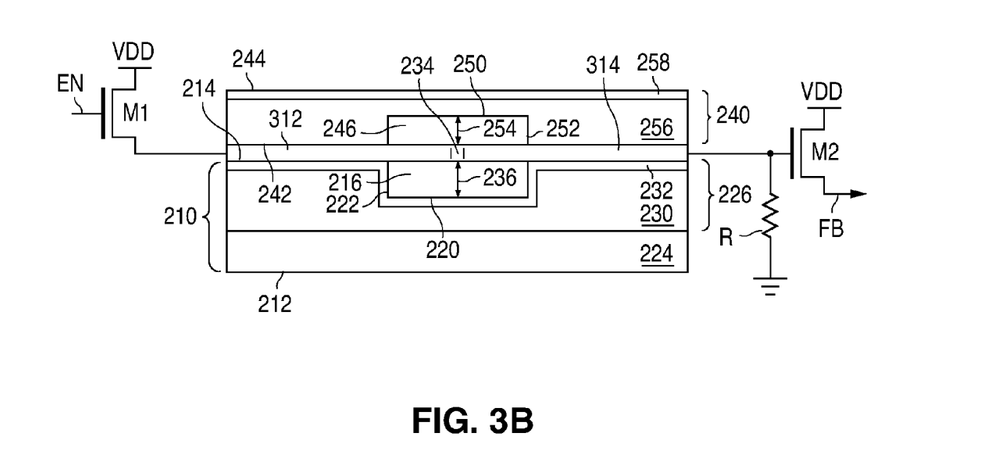
FIG. 3B is a cross-sectional view taken along lines 3B-3B of FIG. 3A.

FIGS. 3A-3B show views that illustrate an example of a galvanic isolation fuse 300 in accordance with an alternate embodiment of the present invention. FIG. 3A shows a plan view, while FIG. 3B shows a cross-sectional view taken along lines 3B-3B of FIG. 3A. Fuse 300 is similar to fuse 200 and, as a result, utilizes the same reference numerals to designate the structures which are common to both fuses.

Fuse 300 differs from fuse 200 in that fuse 300 includes a fuse status circuit 310. As shown in FIGS. 3A-3B, fuse status circuit 310 includes a first sense line 312 that touches the top surface 214 of substrate structure 210, extends across cavity 216, and touches the portion of signal line 234 with the minimum width W that lies over and spaced apart from the bottom surface 220 of cavity 216. Fuse status circuit 310 also includes a second sense line 314 that touches the top surface 214 of substrate structure 210, extends across cavity 216, and touches the portion of signal line 234 with the minimum width W that lies over and spaced apart from the bottom surface 220 of cavity 216. (Additional sense lines which also extend across cavity 216 can also be used so that fuse 300 can be interrogated in multiple ways.)

In addition, as illustrated schematically, fuse status circuit 310 includes an enable transistor M1, a sense transistor M2, and a resistive element R. Enable transistor M1 has a drain connected to a power supply line VDD, a source connected to first sense line 312, and a gate connected to receive an enable signal EN.

Sense transistor M2 has a drain connected to the power supply line VDD, a source that outputs a fuse blow signal FB, and a gate connected to second sense line 314. Resistive element R, in turn, has a first end connected to second sense line 314 and the gate of sense transistor M2, and a second end connected to ground.

During normal operation, when the enable signal EN rises and turns on enable transistor M1, a current flows through enable transistor M1 and resistive element R to ground. The voltage dropped across resistive element R is placed on the gate of sense transistor M2, which turns on in response. As a result, a current flows out of the source of sense transistor M2 in response to a pulse of the enable signal EN when fuse 300 is intact.

When galvanic dielectric structure 266 fails, the section of signal line 234 with the minimum width W pops and provides an open circuit. With fuse 300, however, the pop which forms the open circuit also electrically isolates the first and second sense lines 312 and 314. Thus, the gate of sense transistor M2 is continuously pulled to ground through the resistive element R. As a result, no current flows out of the source of sense transistor M2 in response to a pulse of the enable signal EN after fuse 300 has been blown.

Figure 4A:
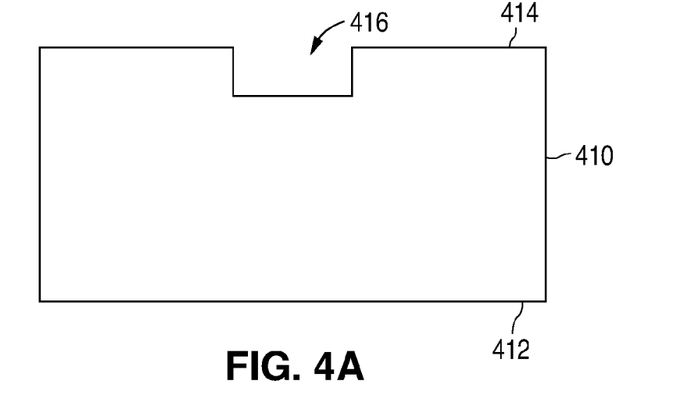
FIGS. 4A-4S are cross-sectional views illustrating an example of a method 400 of forming galvanic isolation fuse 200 in accordance with the present invention.
Figure 4B:
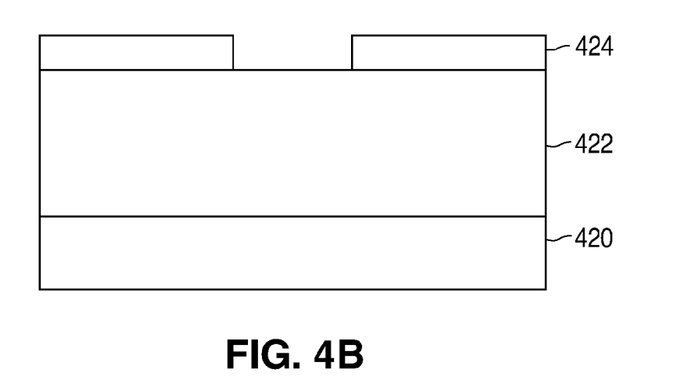
Figure 4C:
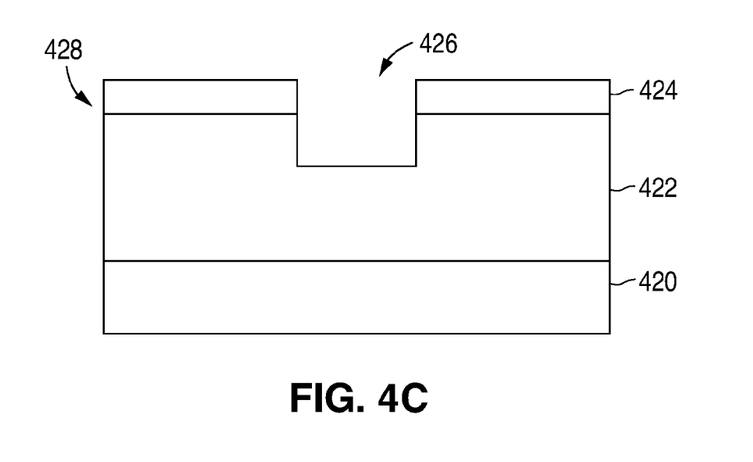
Figure 4D:
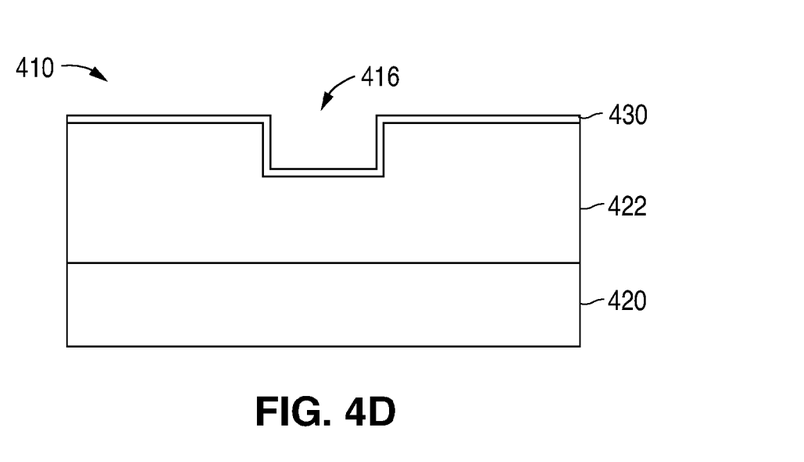
Figure 4E:
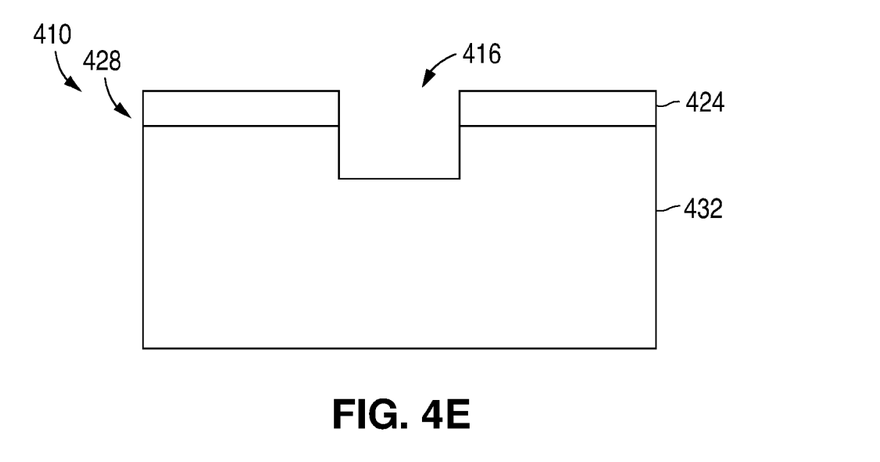
Figure 4F:
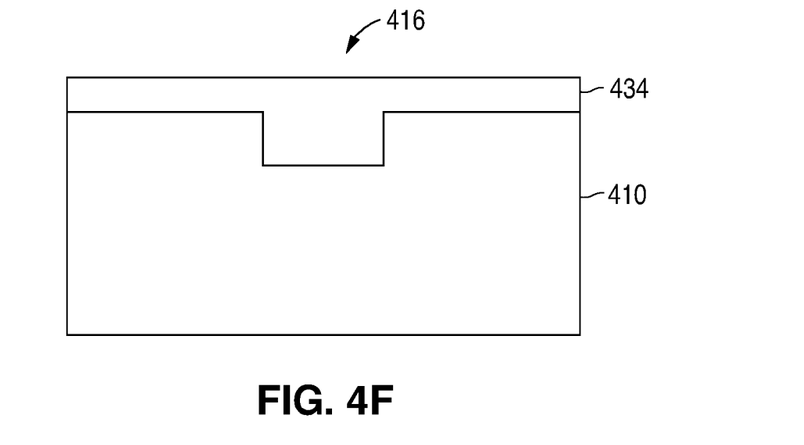
Figure 4G:
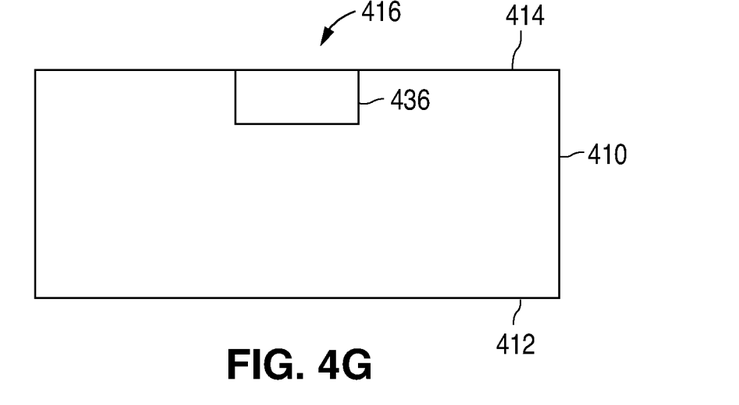
Figure 4H:
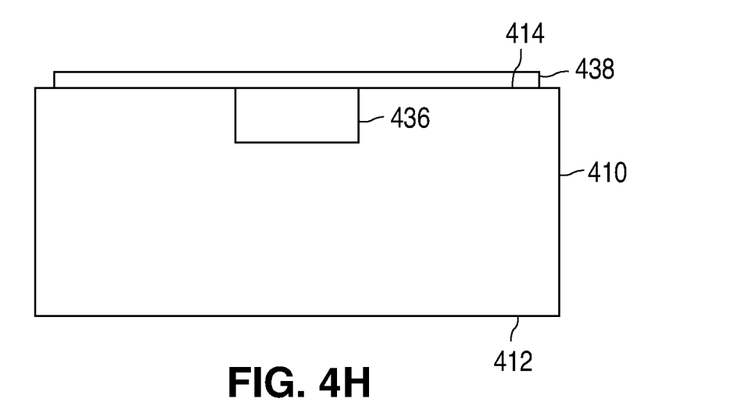
Figure 4I:
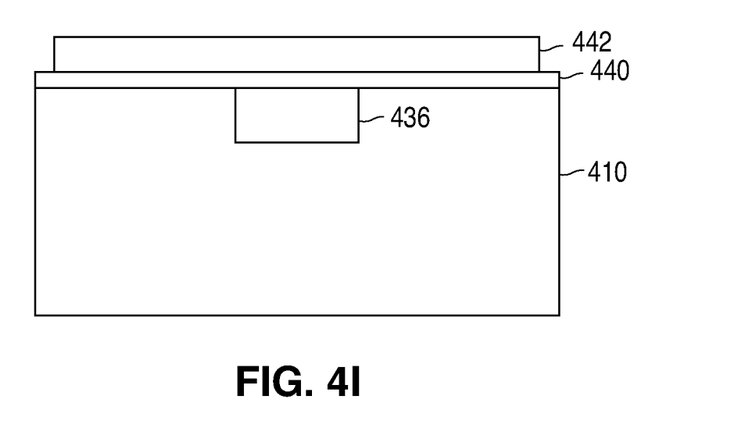
Figure 4J:
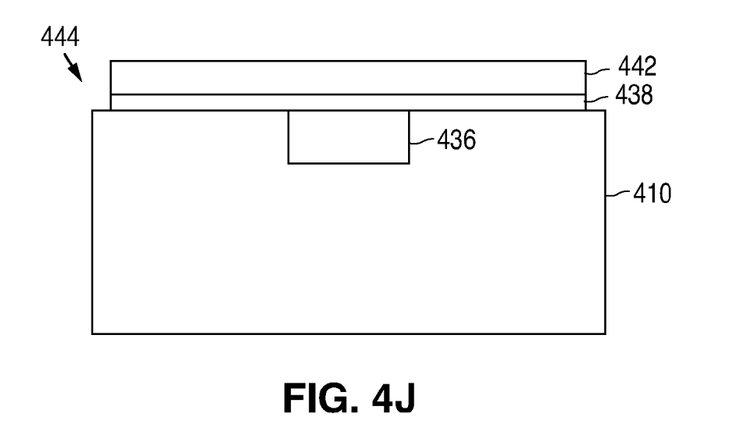
Figure 4K:
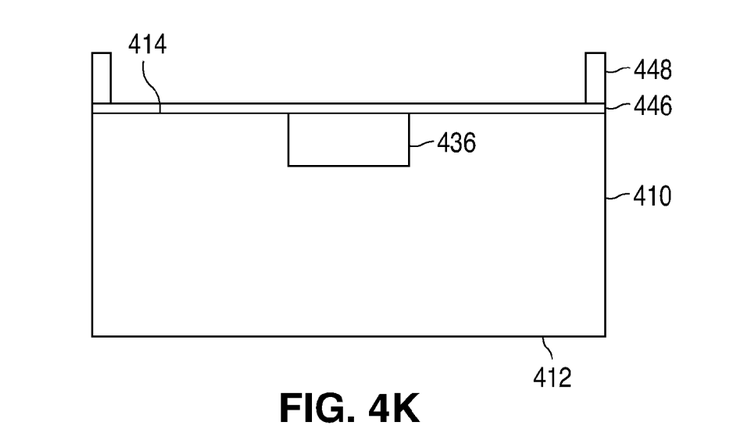
Figure 4L:
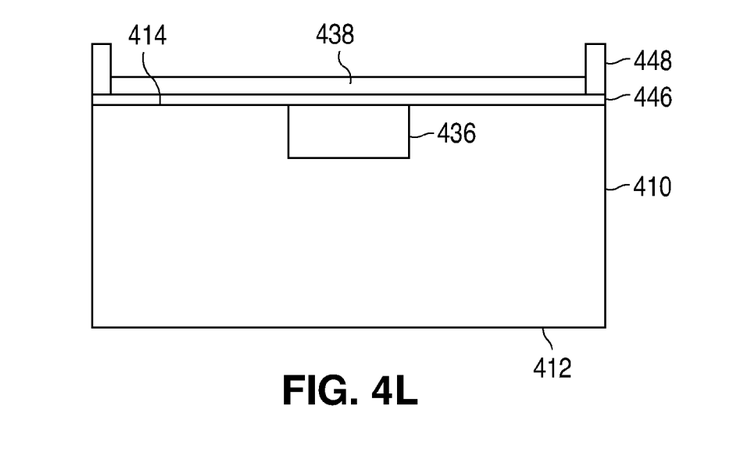
Figure 4M:
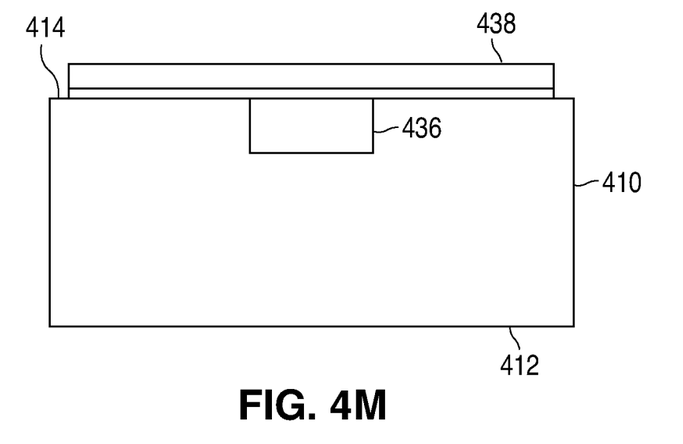
Figure 4N:
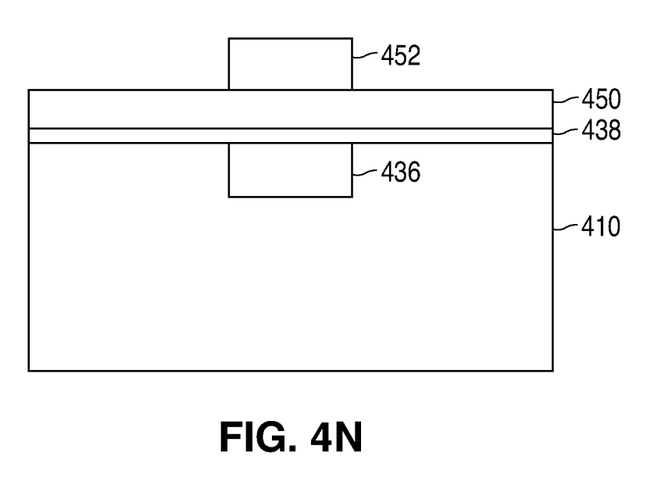
Figure 4O:
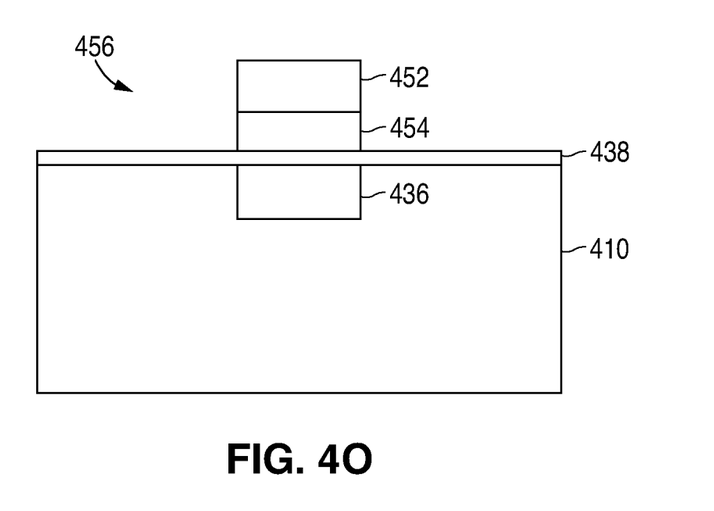
Figure 4P:
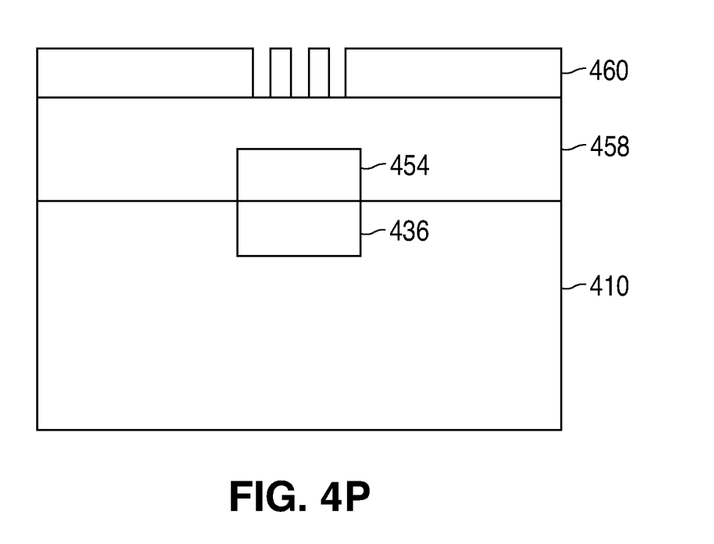
Figure 4Q:
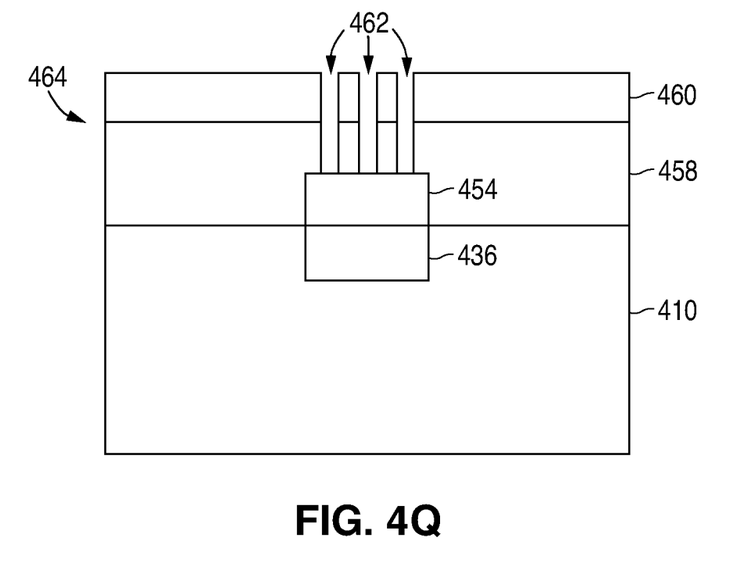
Figure 4R:
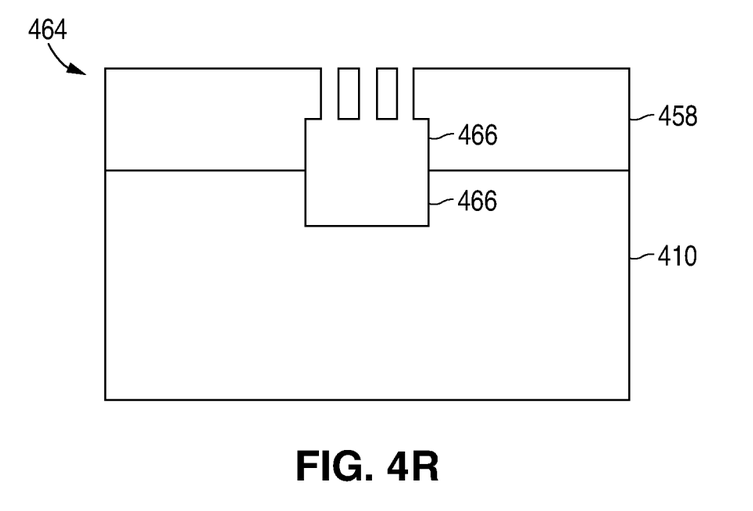
Figure 4S:
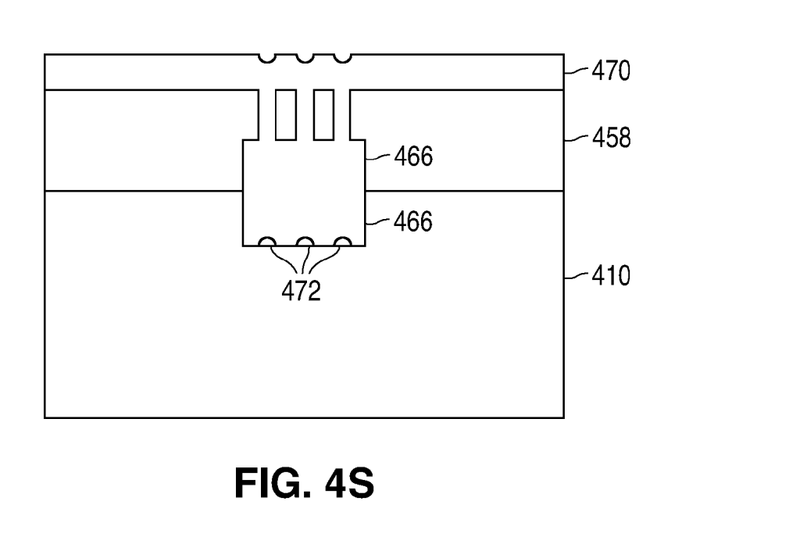

FIGS. 4A-4S show cross-sectional views that illustrate an example of a method 400 of forming galvanic isolation fuse 200 in accordance with the present invention. As shown in FIG. 4A, method 400 begins by forming a substrate structure 410 which has a bottom surface 412, a non-conductive top surface 414, and a cavity 416 in the non-conductive top surface 414.

In the present example, as shown in FIG. 4B, substrate structure 410 is formed in a series of steps that are performed on a conventionally-fabricated silicon wafer 420. A conventionally-fabricated silicon wafer can have, for example, a thickness of 750 μm, a diameter of 200 mm, and a resistivity of 1052 per square centimeter.

As further shown in FIG. 4B, substrate structure 410 can be formed by depositing a layer of silicon dioxide 422 on the top surface of silicon wafer 420, followed by the formation of a patterned photoresist layer 424 approximately 1.0 μm thick on the top surface of oxide layer 422. Oxide layer 422 can be deposited in a conventional manner, such as with chemical vapor deposition using a Novellus Concept One manufactured by Novellus Systems, Inc., of San Jose, Calif., to have a thickness that lies in the approximate range of 5-17 μm.

Patterned photoresist layer 424 is also formed in conventional manner, which includes depositing a layer of photoresist, projecting a light through a patterned black/clear glass plate known as a mask to soften the photoresist regions exposed by the light, and removing the softened photoresist regions to form a pattern in the layer of photoresist.

As shown in FIG. 4C, after patterned photoresist layer 424 has been formed, the exposed regions of oxide layer 422 are etched to form a cavity 426 in the top surface of oxide layer 422, and thereby form an etched structure 428. After the etch, etched structure 428 is rinsed, and patterned photoresist layer 424 is then removed in a conventional manner, such as with acetone. Once patterned photoresist layer 424 has been removed, etched structure 428 is conventionally cleaned to remove organics, such as with a Piranha etch (e.g., using a solution of 50 $H_2SO_4$:1 $H_2O_2$ @ 120° C. removes approximately 240 nm/minute). Next, as shown in FIG. 4D, a layer of silicon nitride 430 is deposited on the top surface of oxide layer 422 to line cavity 426, and form substrate structure 410 with cavity 416. Silicon nitride layer 430 can also be deposited in a conventional manner to have a thickness of approximately 0.6-1.5 μm thick. In the present example, the total thickness of oxide layer 422 and nitride layer 430 is selected to provide voltage isolation of $5000V_{RMS}$.

Alternately, as shown in FIG. 4E, substrate structure 410 can be fabricated by forming patterned photoresist layer 424 on the top surface of a non-conductive wafer 432, such as a quartz wafer. After patterned photoresist layer 424 has been formed, the exposed regions of non-conductive wafer 432 are etched to form cavity 416, and thereby form etched structure 428.

As shown in FIG. 4F, after the formation and cleaning of substrate structure 410, a sacrificial layer 434 is deposited on substrate structure 410 to fill up cavity 416. For example, sacrificial layer 434 can be implemented with a layer of polysilicon. As shown in FIG. 4G, after the deposition of sacrificial layer 434, sacrificial layer 434 is planarized in a conventional manner, such as with chemical-mechanical polishing, until the top surface 414 of substrate structure 410 has been exposed to form a sacrificial plug 436 that fills up cavity 416.

Figure 5:
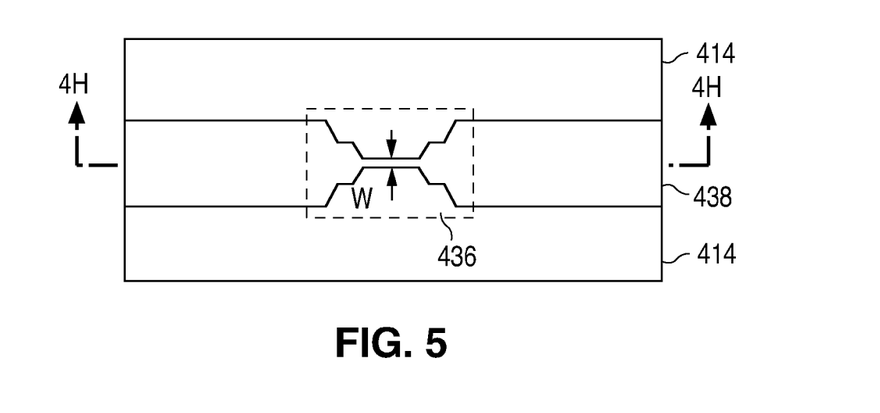
FIG. 5 is a plan view illustrating signal line 438 in accordance with the present invention.

Next, as shown in FIG. 4H, after sacrificial plug 436 has been formed, a signal line 438 is formed on the top surface 414 of substrate structure 410 and sacrificial plug 436. FIG. 5 shows a plan view that illustrates signal line 438 in accordance with the present invention. As shown in FIG. 5, signal line 438 has a number of widths, including a minimum width W of signal line 438 that lies over sacrificial plug 436. Signal line 438 can be formed in a number of different ways.

As shown in FIG. 4I, in a first embodiment, signal line 438 can be formed by sputter depositing a metal layer 440, such as aluminum, onto the top surface 414 of substrate structure 410 and sacrificial plug 436 to a depth that lies in the approximate range of 0.5-1.5 μm. Alternately, metal layer 440 can be implemented with higher resistance materials, such as titanium (Ti), tungsten (W), molybdenum (Mo). Conventional fuses often utilize high resistance materials to limit the maximum voltage that must be applied across the fuse to blow the fuse. In the present example, high resistance materials are not required because a very large voltage is necessarily applied across the fuse when a galvanic dielectric layer fails. In addition, metal layer 440 can also include multiple layers of metal such as, for example, a layer of titanium, a layer of titanium nitride, a layer of aluminum copper, a layer of titanium, and a layer of titanium nitride.

Figure 6:
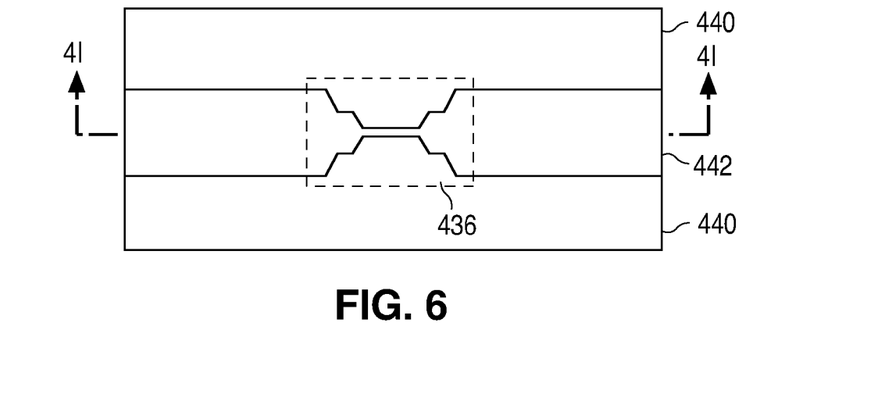
FIG. 6 is a plan view illustrating the formation of patterned photoresist layer 442 in accordance with the present invention.

Once metal layer 440 has been formed, a patterned photoresist layer 442 approximately 1.0 μm thick is formed on the top surface of metal layer 440 in a conventional manner. FIG. 6 shows a plan view illustrating the formation of patterned photoresist layer 442 in accordance with the present invention.

Following the formation of patterned photoresist layer 442, as shown in FIG. 4J, metal layer 440 is etched to remove the exposed regions of metal layer 440, and form signal line 438 and an etched structure 444. Metal layer 440 can be etched using a dry etch such as reactive ion etching, or a timed wet etch. For example, aluminum can be wet etched in a 10:1 hydrogen fluoride solution for the necessary period of time. After the etch, etched structure 444 is rinsed, and patterned photoresist layer 442 is then removed in a conventional manner, such as with acetone. Once patterned photoresist layer 442 has been removed, etched structure 444 is conventionally cleaned to remove organics, such as with a Piranha etch (e.g., using a solution of 50 $H_2SO_4$: 1 $H_2O_2$ @ 120° C. removes approximately 240 nm/minute).

Alternately, in a second embodiment, as shown in FIG. 4K, signal line 438 can be formed by depositing a seed layer 446 to touch the top surface 414 of substrate structure 410 and sacrificial plug 436. For example, seed layer 446 can be formed by depositing 300 Å of titanium, 3000 Å of copper, and 300 Å of titanium. Once seed layer 446 has been formed, a plating mold 448 is formed on the top surface of seed layer 446.

As shown in FIG. 4L, following the formation of plating mold 448, copper is electroplated to form signal line 438. As shown in FIG. 4M, after the electroplating, plating mold 448 and the underlying regions of seed layer 446 are removed to expose signal line 438.

After signal line 438 has been formed, as shown in FIG. 4N, a sacrificial layer 450 is deposited on substrate structure 410 and signal line 438. For example, sacrificial layer 450 can be implemented with a layer of polysilicon. Polysilicon becomes amorphous below approximately 575° C., but can be deposited down to approximately 200° C. Sacrificial layer 450 can be optionally planarized in a conventional manner, such as with chemical-mechanical polishing. Once sacrificial layer 450 has been deposited and optionally planarized, a patterned photoresist layer 452 is conventionally formed on sacrificial layer 450.

As shown in FIG. 4O, after patterned photoresist layer 452 has been formed, the exposed regions of sacrificial layer 450 are etched to form a sacrificial cap 454 that touches sacrificial plug 436 and signal line 438, and an etched structure 456. After the formation of sacrificial cap 454, etched structure 456 is rinsed using standard procedures, followed by the conventional removal of patterned photoresist layer 452, such as with acetone. Etched structure 456 is then cleaned in a conventional manner, such as with a Piranha etch.

Figure 7:
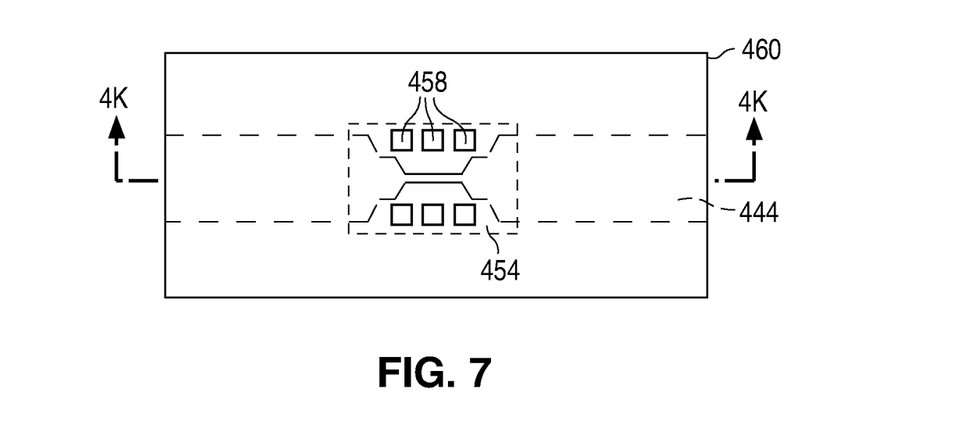
FIG. 7 is a plan view illustrating the formation of patterned photoresist layer 460 in accordance with the present invention.

Next, as shown in 4P, a non-conductive layer 458 is deposited on substrate structure 410, signal line 438, and sacrificial cap 454 in a conventional manner. Non-conductive layer 458 can be implemented with, for example, silicon dioxide. Non-conductive layer 458 can be optionally planarized in a conventional manner, such as with chemical-mechanical polishing. Once non-conductive layer 458 has been deposited and optionally planarized, a patterned photoresist layer 460 is conventionally formed on non-conductive layer 458. FIG. 7 shows a plan view that illustrates the formation of patterned photoresist layer 460 in accordance with the present invention.

Figure 8:
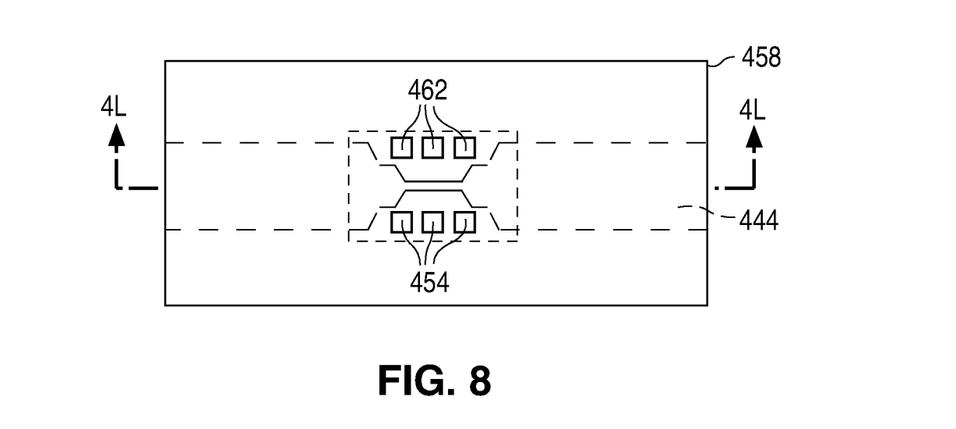
FIG. 8 is a plan view illustrating non-conductive layer 458 after patterned photoresist layer 460 has been removed in accordance with the present invention.

As shown in FIG. 4Q, after patterned photoresist layer 460 has been formed, the exposed regions of non-conductive layer 458 are etched to form a number of openings 462 that expose sacrificial cap 454, and an etched structure 464. After the openings 462 have been formed, etched structure 464 is rinsed using standard procedures, followed by the conventional removal of patterned photoresist layer 460, such as with acetone. Etched structure 464 is then cleaned in a conventional manner, such as with a Piranha etch. FIG. 8 shows a plan view that illustrates non-conductive layer 458 after patterned photoresist layer 460 has been removed in accordance with the present invention.

Next, as shown in 4R, etched structure 464 is etched with an etchant that removes sacrificial cap 454 and sacrificial plug 436 to form a single fuse cavity 466, while at the same time removing substantially none of substrate structure 410, signal line 438, and non-conductive layer 458. For example, when sacrificial cap 454 and sacrificial plug 436 are formed from polysilicon, xenon difluoride ($XeF_2$) can be utilized to attack and remove sacrificial cap 454 and sacrificial plug 436, while at the same time removing substantially none of substrate structure 410, signal line 438, and non-conductive layer 458.

As shown in FIG. 4S, after fuse cavity 466 has been formed, a sealant layer 470 is deposited onto the top surface of non-conductive layer 458 to close and pinch off the openings 462. As further shown in FIG. 4S, before the openings 462 become pinched off, portions of sealant layer 470 fall through the openings 462 and accumulate on the bottom surface of fuse cavity 466 to form sealant lumps 472.

Sealant layer 470 can be implemented with, for example, sequential layers of silicon dioxide, nitride, and oxynitride. In addition, sealant layer 470 can be deposited using low-pressure chemical vapor deposition (LPCVD), with a pressure of approximately 30 mT, in an ambient of sulfur hexafluoride ($SF_6$).

Thus, after openings 462 have been pinched off, fuse cavity 466 is sealed and filled with $SF_6$. $SF_6$, in turn, reduces sparking or arcing that may occur after the fuse has been blown. In addition, sealant layer 470 provides a moisture barrier. Following the formation of sealant layer 470, method 400 continues with convention steps.

Thus, an example of a method of forming galvanic isolation fuse 200 has been described. Galvanic isolation fuse 200 can be formed as a separate standalone die, or the steps to form galvanic isolation fuse 200 can be integrated into the steps used to form a conventional galvanic isolation die, such as die 122 shown in FIG. 1. In addition, the steps to form galvanic isolation fuse 200 can also be integrated into the steps used to form a high-voltage die, such as high-voltage die 120, or a low-voltage die, such as low-voltage die 124.

Further, galvanic isolation fuse 300 can be formed by modifying patterned photoresist layer 442 shown in FIG. 4H and FIG. 6 so that the first sense line 312 and the second sense line 314 are formed at the same time that signal line 438 is formed. In addition, the enable and sense transistors M1 and M2 can both be formed in either the high-voltage die or the low-voltage die.

It should be understood that the above descriptions are examples of the present invention, and that various alternatives of the invention described herein may be employed in practicing the invention. For example, a pair of fuses 300 can be formed in parallel with the minimum width W of a first fuse of the pair being wider than the minimum width of a second fuse of the pair. As a result, more current is required to blow the wider fuse than the narrower fuse.

Thus, in the event of a gradual failure of a galvanic dielectric layer rather than a sudden failure, the fuse with the smaller minimum width W blows before the fuse with the larger minimum width W, thereby functioning as an early warning of a failure in the galvanic dielectric layer.

As a result, it is intended that the following claims define the scope of the invention and that structures and methods within the scope of these claims and their equivalents be covered thereby.

What is claimed is:

1. A semiconductor-structure comprising:
   a substrate structure having a bottom surface, a non-conductive top surface, and a first cavity in the non-conductive surface, the first cavity having a bottom surface and a side wall surface that extends from the bottom surface of the first cavity to the top surface of the substrate structure, wherein the first cavity exposes only non-conductive regions of the substrate structure;
   a conductive signal line, touching the top surface of the substrate structure, and extending completely across the first cavity creating a gap that lies between the signal line and the bottom surface of the cavity, wherein the signal line has a plurality of widths, also wherein a minimum width of the signal line lies over the first cavity in the substrate structure;
   a non-conductive structure having a bottom surface, a top surface, and a second cavity in the bottom surface of the non-conductive structure, the bottom surface of the non-conductive structure touching the signal line and the top surface of the substrate structure, the second cavity in the non-conductive structure having a top surface and a side wall surface that extends from the top surface of the cavity in the non-conductive structure to the bottom surface of the non-conductive structure;
   wherein a gap lies between the signal line and the top surface of the second cavity in the non-conductive structure;
   wherein the second cavity in the non-conductive structure lies over the first cavity in the substrate structure;
   wherein the conductive signal line has a galvanic end and a circuit end; and
   wherein the cavity in the substrate structure lies between and spaced apart from the galvanic end and the circuit end of the signal line.

2. The semiconductor structure of claim 1 wherein the first and second cavities in the substrate structure and the non-conductive structures respectively expose only non-conductive regions of the structures.

3. The semiconductor structure of claim 1 and further comprising a galvanically-isolated structure having a first conductive structure electrically connected to the galvanic end of the signal line, a second conductive structure, and a dielectric layer that lies between and touches the first conductive structure and the second conductive structure.

4. The semiconductor structure of claim 3 wherein a resistance of the signal line is greater than a resistance of the galvanically-isolated structure.

5. The semiconductor structure of claim 3 and further comprising an electronic circuit electrically connected to the circuit end of the signal line.

6. The semiconductor structure of claim 5 and further comprising a die having an electronic circuit electrically connected to the second conductive structure of the galvanically-isolated structure.

7. The semiconductor structure of claim 1 and further comprising:
- a first sense line that touches the top surface of the substrate structure, extends across the cavity in the substrate structure, and touches a portion of the signal line that lies over and spaced apart from the bottom surface of the cavity in the substrate structure; and
- a second sense line that touches the top surface of the substrate structure, extends across the cavity in the substrate structure, and touches a portion of the signal line that lies over and spaced apart from the bottom surface of the cavity in the substrate structure.

8. The semiconductor structure of claim 7 and further comprising:
- an enable transistor electrically connected to the first sense line; and
- a sense transistor electrically connected to the second sense line.

* * * * *